(12) United States Patent
Chang et al.

(10) Patent No.: US 8,404,058 B2
(45) Date of Patent: Mar. 26, 2013

(54) PROCESS FOR SURFACE TREATING ALUMINUM OR ALUMINUM ALLOY AND HOUSING MADE BY SAME

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW);
Zhi-Jie Hu, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 169 days.

(21) Appl. No.: 13/091,282

(22) Filed: Apr. 21, 2011

(65) Prior Publication Data
US 2012/0042991 A1  Feb. 23, 2012

(30) Foreign Application Priority Data

Aug. 23, 2010 (CN) ........................ 2010 1 0273104

(51) Int. Cl.
| | | |
|---|---|---|
| C23C 8/36 | (2006.01) | |
| C23C 8/24 | (2006.01) | |
| C23C 8/12 | (2006.01) | |
| C23C 14/35 | (2006.01) | |
| C23C 8/08 | (2006.01) | |
| C22C 21/00 | (2006.01) | |

(52) U.S. Cl. ......... 148/222; 148/437; 148/239; 148/317
(58) Field of Classification Search .................. 148/222, 148/437, 239, 317
See application file for complete search history.

Primary Examiner — Jessee R. Roe
(74) Attorney, Agent, or Firm — Altis Law Group, Inc.

(57) ABSTRACT

A housing includes a substrate made of aluminum or aluminum alloy, an ion implantation layer formed on the substrate, and a vacuum coated layer formed on the ion implantation layer. The ion implantation layer is implanted with one or more ion species selected from the group consisting of nitrogen ion, oxygen ion, and boron ion and is substantially comprised of one or more selected from the group consisting of aluminum nitride, aluminum oxide, and aluminum boride. The implanted ions can improve the compactness of the ion implantation layer. Thus, the corrosion resistance of the housing can be improved.

13 Claims, 3 Drawing Sheets

PROCESS FOR SURFACE TREATING ALUMINUM OR ALUMINUM ALLOY AND HOUSING MADE BY SAME

BACKGROUND

1. Technical Field

The disclosure generally relates to processes for surface treating aluminum or aluminum alloy and housings made of aluminum or aluminum alloy treated by the surface treatment.

2. Description of Related Art

Due to having many good properties such as light weight and quick heat dissipation, aluminum and aluminum alloy are widely used in manufacturing components (such as housings) of electronic devices. Aluminum and aluminum alloy are usually anodized to form an oxide coating thereon to achieve a decorative and wear resistant surface. However, the anodizing process is complicated with a low efficiency.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary process for surface treating aluminum or aluminum alloy and housings made of aluminum or aluminum alloy treated by the surface treatment. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
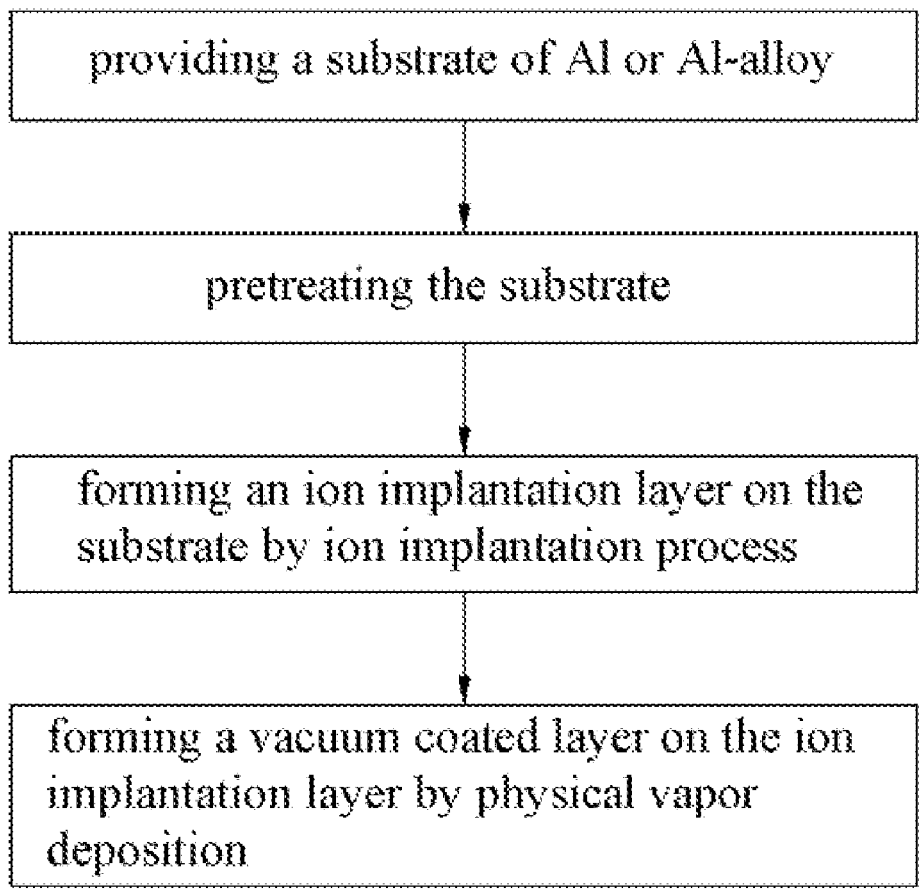
FIG. 1 is a block diagram of an exemplary process for surface treating aluminum or aluminum alloy.
Figure 2:
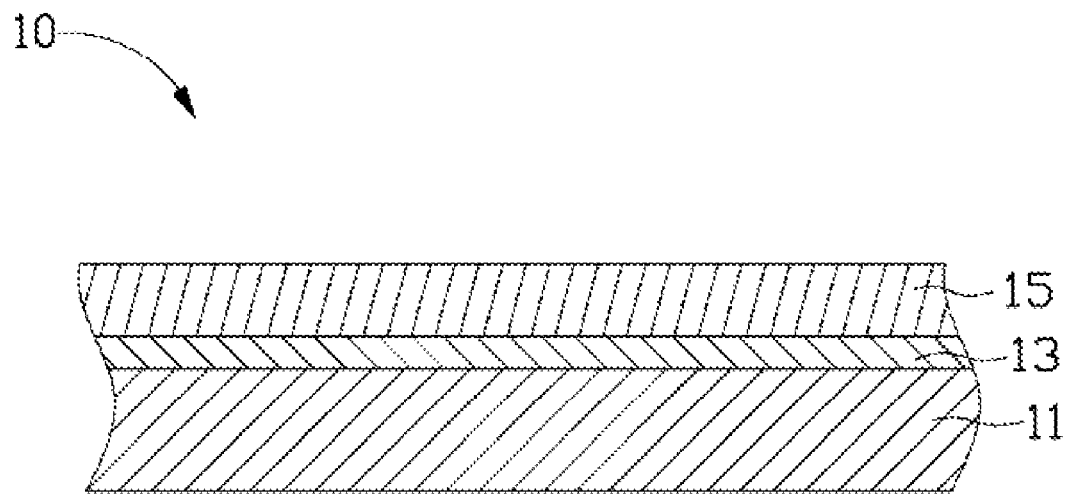
FIG. 2 illustrates a cross-sectional view of an exemplary embodiment of a housing made of aluminum or aluminum alloy treated by present process.

Referring to FIGS. 1 and 2, an exemplary method for surface treating aluminum or aluminum alloy includes at least the following steps.

A substrate 11 made of aluminum or aluminum alloy is provided. The substrate 11 may be produced by punching.

The substrate 11 is pretreated. In this step, the substrate 11 is polished to remove any oxide coating formed on the substrate 11. The polished substrate 11 may have a surface roughness Rz lower than 1.2 μm. Then, the substrate 11 may be ultrasonically cleaned in a solution containing alcohol or acetone, removing impurities such as grease or dirt from the substrate 11. Then the substrate 11 is rinsed with deionized water and dried.

Ion species are implanted in the substrate 11 to form an ion implantation layer 13 on the substrate 11 by ion implantation process.

Figure 3:
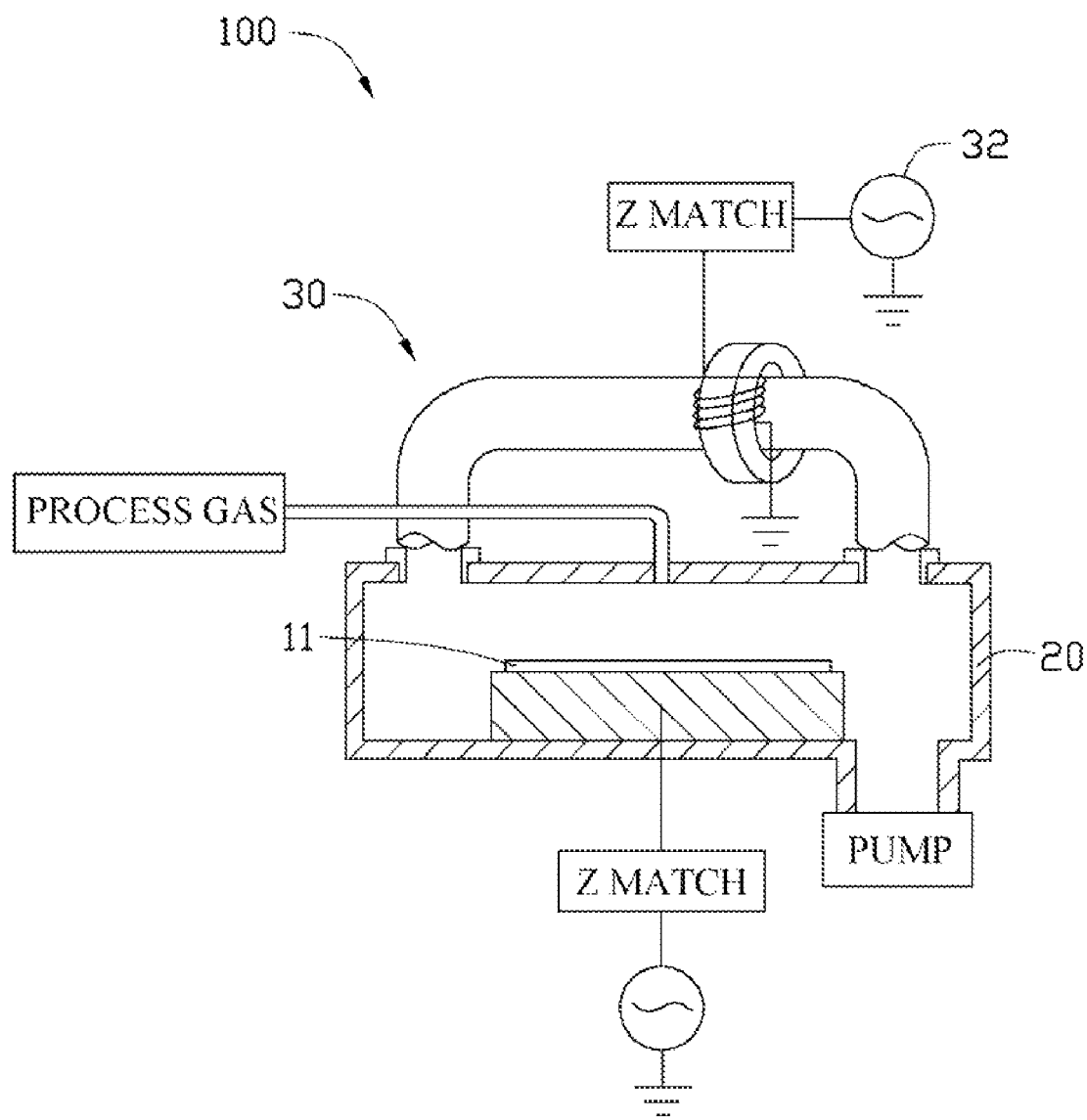
FIG. 3 is a schematic view of an ion implantation machine used in the present process.

In an exemplary embodiment, the ion implantation process is performed by supplying a process gas into a processing chamber 20 of an ion implantation machine 100 as shown in FIG. 3. The machine 100 includes a plasma source 30 coupled to a RF source power 32. Plasma is generated by applying the RF source power 32 to dissociate ions from the process gas, thereby forming a source of ions that are accelerated toward and implanted into the substrate 11. The implanted ions react with the atoms and molecules of the surface layer of the substrate 11. Thus, the ion implantation layer 13 is formed and is comprised of distinct materials from the substrate 11.

The implanted ions may be one or more ion species selected from the group consisting of nitrogen ion, oxygen ion, and boron ion. The process gas supplied into the processing chamber 20 may be one or more selected from the group consisting of $N_2$, $B_2H_6$, and $O_2$, with the process gas having a purity of about 99.99%. The ion implantation layer 13 is substantially comprised of one or more of the compounds having supersaturated phase selected from the group consisting of aluminum nitride (AlN), aluminum oxide ($Al_2O_3$), and aluminum boride (AlBn).

The ion implantation process may be performed under the following conditions. The processing chamber 20 is evacuated to maintain a vacuum degree of about $1 \times 10^{-4}$ Pa. The process gas supplied into the processing chamber 20 maintains a working atmosphere from about 0.1 Pa to about 0.5 Pa. The RF source power 32 may be controlled from about 30 to about 100 thousand volts (kV) to form a beam of the ions with the beam of ions having an intensity from about 1 to about 5 milliamperes (mA). The density of the ions implanted in the ion implantation layer 13 may be from about $1 \times 10^{16}$ ions per square centimeter (ions/cm$^2$) to about $1 \times 10^{18}$ ions/cm$^2$. The processing chamber 20 may be maintained at a normal room temperature.

A vacuum coated layer 15 is then formed on the ion implantation layer 13 by physical vapor deposition (PVD), such as magnetron sputtering, or vacuum evaporation. The vacuum coated layer 15 may be a layer of metal oxynitride, nitride, carbonitride, oxycarbide, or oxycarbonitride. The metal for the vacuum coated layer 15 may include one or more selected from among Al, Cr, Ti, and Zr.

In one exemplary embodiment, the vacuum coated layer 15 is an aluminum oxynitride (AlON) layer formed by magnetron sputtering. An exemplary magnetron sputtering process for forming the vacuum coated layer 15 may be performed by the following steps. The substrate 11 having the ion implantation layer 13 is placed in a vacuum chamber of a magnetron sputtering machine (not shown). The vacuum chamber is evacuated to maintain a vacuum level from about $5.0 \times 10^{-3}$ to about $8.0 \times 10^{-3}$ Pa and is heated to a temperature from about 50 to about 150° C. Argon, oxygen, and nitrogen are simultaneously floated into the vacuum chamber. The flux of the argon is from about 100 Standard Cubic Centimeters per Minute (sccm) to about 250 sccm. The flux of the oxygen is from about 5 to about 40 sccm, and the flux of the nitrogen is from about 5 to about 60 sccm. A bias voltage is applied to the substrate 11 in a range from about −50 volts to about −200 volts. An aluminum target is evaporated at a power from about 5 kw to about 10 kw for about 20 minutes to about 60 minutes, depositing the AlON layer on the ion implantation layer 13.

The implanted ions can fill pores in the substrate 11 and improve the density of the ion implantation layer 13. Furthermore, the ion implantation layer 13 is a homogeneous amorphous film. Thus, the corrosion resistance of the substrate 11 can be improved.

FIG. 2 shows an exemplary device housing 10 made of aluminum or aluminum alloy processed by the surface treating as described above. The housing 10 may be used for electronic devices, such as mobile phones. The housing 10 includes the substrate 11 made of aluminum or aluminum alloy, the ion implantation layer 13 formed on the substrate 11, and the vacuum coated layer 15 formed on the ion implantation layer 13. The ion implantation layer is implanted with one or more ion species selected from the group consisting of nitrogen ion, oxygen ion, and boron ion. The ion implantation layer 13 is substantially comprised of one or more of the compounds having supersaturated phase selected from the group consisting of aluminum nitride (AlN), aluminum oxide ($Al_2O_3$), and aluminum boride (AlBn). The thickness of the vacuum coated layer 15 may be from about 1 to about 2.7 μm.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for surface treating aluminum or aluminum alloy, the method comprising the following steps of:
   providing a substrate made of aluminum or aluminum alloy;
   forming an ion implantation layer on the substrate by implanting one or more ion species selected from the group consisting of nitrogen ion, oxygen ion, and boron ion to the substrate; and
   forming a vacuum coated layer on the ion implantation layer by physical vapor deposition.

2. The method of claim 1, wherein the step of forming the ion implantation layer further comprises supplying a process gas into a processing chamber of an ion implantation machine to generate the ions implanted into the substrate.

3. The method of claim 2, wherein the process gas is one or more of the group consisting of $N_2$, $B_2H_6$, and $O_2$.

4. The method of claim 3, wherein the processing chamber is evacuated to maintain a vacuum degree of about $1\times10^{-4}$ Pa, the process gas maintains a working atmosphere from about 0.1 Pa to about 0.5 Pa in the processing chamber.

5. The method of claim 2, wherein the step of forming the ion implantation layer further comprises supplying a RF source power to dissociate the ions from the process gas.

6. The method of claim 5, wherein the RF source power is controlled from about 30 to about 100 kV to form a beam of the ions with an intensity from about 1 to about 5 mA.

7. The method of claim 1, wherein the density of the ions implanted in the ion implantation layer is from about $1\times10^{16}$ ions/$cm^2$ to about $1\times10^{18}$ ions/$cm^2$.

8. The method of claim 1, wherein the ion implantation layer is mainly comprised of one or more selected from the group consisting of aluminum nitride, aluminum oxide, and aluminum boride.

9. The method of claim 1, wherein the vacuum coated layer is a layer of metal oxynitride, nitride, carbonitride, oxycarbide, or oxycarbonitride.

10. The method of claim 9, wherein the metal for the vacuum coated layer is one or more selected from the group consisting of Al, Cr, Ti, and Zr.

11. The method of claim 1, wherein the vacuum coated layer is an aluminum oxynitride layer formed by magnetron sputtering.

12. The method of claim 11, wherein the magnetron sputtering comprises the following steps: simultaneously applying argon, oxygen, and nitrogen, the flux of the argon being from about 100 to about 250 sccm, the flux of the oxygen being from about 5 to about 40 sccm and the flux of the nitrogen being from about 5 to about 60 sccm; applying a bias voltage to the substrate in a range from about −50 volts to about −200 volts; and evaporating an aluminum target at a power from about 5 kw to about 10 kw for about 20 to about 60 minutes.

13. The method of claim 1, wherein the method further comprises polishing and ultrasonically cleaning the substrate before forming the ion implantation layer.

* * * * *